United States Patent
Huang et al.

(10) Patent No.: US 7,935,776 B2
(45) Date of Patent: May 3, 2011

(54) RADIATION CURABLE AND DEVELOPABLE POLYURETHANE AND RADIATION CURABLE AND DEVELOPABLE PHOTO RESIST COMPOSITION CONTAINING THE SAME

(75) Inventors: Wei Hsiang Huang, Taoyuan Hsein (TW); Ying Jen Chen, Taoyuan Hsein (TW); Jui Ming Chang, Taoyuan Hsein (TW); Chun Hung Kuo, Taoyuan Hsein (TW); Hong Ye Lin, Taoyuan Hsein (TW); Li Chung Chang, Taoyuan Hsein (TW)

(73) Assignee: AGI Corporation, Taipei (TW)

( * ) Notice: Subject to any disclaimer, the term of this patent is extended or adjusted under 35 U.S.C. 154(b) by 512 days.

(21) Appl. No.: 12/076,597

(22) Filed: Mar. 20, 2008

(65) Prior Publication Data

US 2008/0234403 A1   Sep. 25, 2008

(30) Foreign Application Priority Data

Mar. 21, 2007  (TW) ............................... 96109678 A
Jan. 22, 2008  (TW) ............................... 97102304 A

(51) Int. Cl.
- *C08G 18/06* (2006.01)
- *C08G 18/00* (2006.01)
- *C08G 18/18* (2006.01)
- *C08F 2/50* (2006.01)
- *C08F 2/46* (2006.01)

(52) U.S. Cl. ............. 528/85; 528/76; 528/271; 528/272; 528/59; 528/65; 528/75; 528/81; 528/83; 522/90; 522/96; 522/97; 522/113; 522/114; 522/121; 522/120; 522/173; 522/174; 522/178; 522/179; 522/182; 522/100; 522/168; 522/170; 522/150; 522/151; 522/152; 430/176; 430/175; 430/177; 430/270.1; 430/281.1; 430/284.1; 430/906; 430/311; 430/330; 430/331; 525/460

(58) Field of Classification Search .................... 522/90, 522/96, 97, 113, 114, 120, 121, 173, 174, 522/178, 179, 182, 100, 168, 170, 150, 151, 522/152; 430/176, 175, 177, 270.1, 281.1, 430/284.1, 906, 311, 330, 331; 528/76, 310, 528/44, 85, 75, 81, 83, 270, 272, 59, 65; 525/460

See application file for complete search history.

(56) References Cited

U.S. PATENT DOCUMENTS

| | | | | | |
|---|---|---|---|---|---|
| 4,153,778 | A | * | 5/1979 | Park et al. | 528/76 |
| 4,358,354 | A | * | 11/1982 | Iida et al. | 522/96 |
| 4,877,711 | A | * | 10/1989 | Aoai et al. | 430/176 |
| 5,290,663 | A | * | 3/1994 | Huynh-Tran | 430/284.1 |
| 5,977,215 | A | * | 11/1999 | Tien et al. | 523/415 |
| 6,331,376 | B1 | * | 12/2001 | Kojima et al. | 430/284.1 |
| 7,374,862 | B2 | * | 5/2008 | Tanaka et al. | 430/284.1 |
| 7,476,484 | B2 | * | 1/2009 | Sailer et al. | 430/270.1 |
| 2006/0102051 | A1 | * | 5/2006 | Tanaka et al. | 106/218 |

* cited by examiner

*Primary Examiner* — Sanza L McClendon
(74) *Attorney, Agent, or Firm* — Muncy, Geissler, Olds & Lowe, PLLC

(57) ABSTRACT

The present invention relates to a radiation curable and developable polyurethane which is characterized by having a carboxy group in its main chain and a acryloyl group in its side chain and comprising the following repeat units (I), (II), and (II) in a random arrangement:

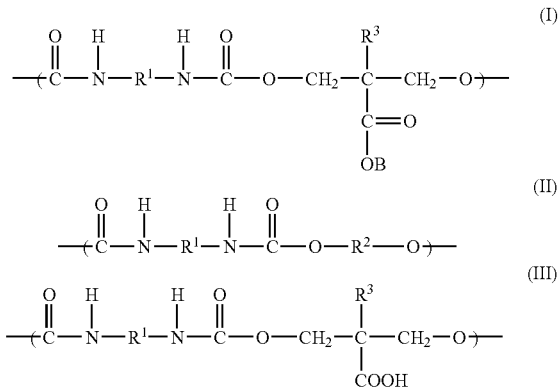

wherein $R^1$, $R^2$, $R^3$, $R^4$, and T are defined in the specification. The polyurethane has a weight molecular weight measured by GPC in a range of from 3,000 to 400,000; an acid value in a range of from 5 to 120 mgKOH/g. The present invention also relates to a radiation curable and developable composition containing the polyurethane.

9 Claims, No Drawings

RADIATION CURABLE AND DEVELOPABLE POLYURETHANE AND RADIATION CURABLE AND DEVELOPABLE PHOTO RESIST COMPOSITION CONTAINING THE SAME

FIELD OF THE INVENTION

The present invention relates to radiation curable and developable polyurethanes and a radiation curable and developable photo resist composition containing the polyurethanes.

BACKGROUND OF THE INVENTION

Color filter used in thin film transistor liquid displayer (TFT LCD) is a key component in conventional liquid displayers (LCDs), which can be used in the LCD for displaying the images in colors. The color filter mainly serves for transferring white light into three primary color lights, i.e. red (R), green (G), and blue (B) lights to display a full-color image on the displayer.

The production of the pattern layer of the color filter mainly comprises the following steps: uniformly coating a photo resist on a substrate by spin-coating method; removing solvent contained in the photo resist by pre-baking; selectively exposing the substrate at the area where is to be cured through a mask; developing the exposed substrate with an alkali solution; and then heating the substrate to cure the photo resist. Such steps are repeated three times to form red, green, and blue colors on the substrate sequentially.

In current color LCDs, they mainly use glass substrate as the substrate, which encounters problems of easily breaking and thick and heavy. To solve these problems, many efforts have made to develop new material suitable for producing flexible displayers to achieve purposes of lighting, not easily breaking, portable and flexible. In Japan Patent Publication No. Hei 11-271736, it disclosed a displayer with using a plastic substrate as the substrate. However, such a plastic substrate still encounters a problem of not being processed at an elevated temperature. Moreover, in Japan Patent Publication No. 2000-214468, it mentioned a low-temperature process for processing a plastic substrate.

Under the above environments, the present inventors have conducted an investigation to develop radiation curable and developable polyurethane and a radiation curable and developable composition, which can be applied to both glass and plastic substrates, and are suitable for both high-temperature process for glass substrate and low-temperature process for plastic glass to produce color filter, and thus completed the present invention.

SUMMARY OF THE INVENTION

The present invention relates to radiation curable and developable polyurethanes and a radiation curable and developable photo resist composition containing the polyurethanes.

More particularly, the present invention relates to radiation curable and developable polyurethanes which are characterized by having a carboxy group in its main chain and an acryloyl group in its side chain.

The radiation curable and developable polyurethanes of the present invention are characterized by having a carboxy group in its main chain and an acryloyl group in its side chain and comprising the following repeat units (I), (II), and (II) in a random arrangement:

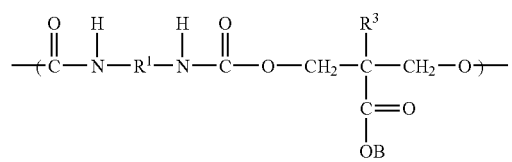

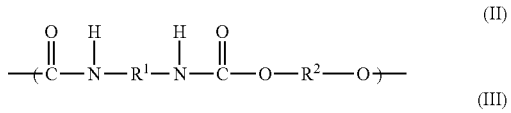

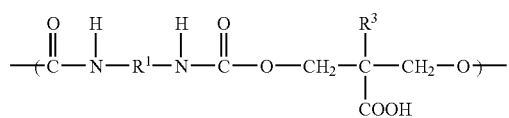

wherein:
$R^1$ represents a $C_{1-12}$ straight or branched alkylene group, a $C_{3-8}$ cyclic alkylene group, a phenylene group, a biphenylene group, a naphthalene group, a xylenenyl group, a divalent toludine group, a group of -Ph-A-Ph- (wherein A represents $CH_2$, —NH—, or —O—), these groups are each optionally substituted with a $C_{1-6}$ alkyl group; $R^2$ represents a divalent aliphatic group which optionally has one or more OH substituents, wherein the OH substituents are optionally further reacted with a diisocyanate group; $R^3$ represents a $C_{1-6}$ straight or branched alkyl group which optionally has one or more OH substituents, wherein the OH substituents are optionally further reacted with a diisocyanate group; B represents the groups represented by formula (IV) or (V):

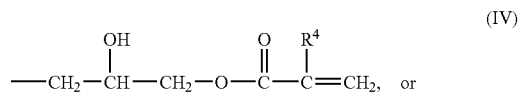

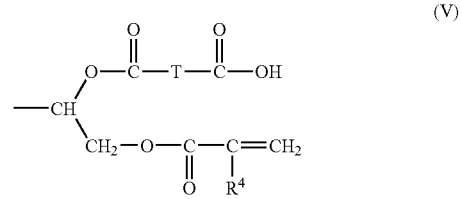

in which $R^4$ represents H or $CH_3$; and
T represents one or more substituents selected from the group consisting of the following formulae:

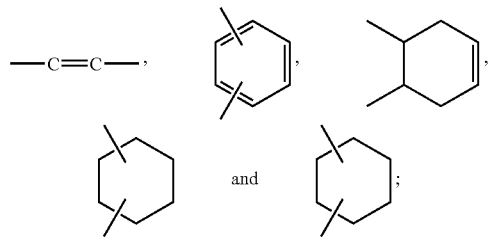

the polyurethanes have an average weight molecular weight measured by GPC in a range of from 3,000 to 400,000; an acid value in a range of from 5 to 120 mgKOH/g.

The radiation curable and developable polyurethanes having a carboxy group in its main chain and a acryloyl group in its side chain and comprising the following repeat units (I), (II), and (II) in a random arrangement are prepared by the process comprising the steps of: (a) reacting a carboxylic acid having at least two hydroxyl groups (preferably a carboxylic acid having two hydroxyl groups), a polyol (preferably a diol) and a diisocyanate to obtain a polyurethane having a carboxyl group in its main chain; (b) ring-opening an epoxy-containing acrylate with the carboxyl acid on the main chain of the product in step (a) to obtain a polyurethane having a hydroxyl group and an acryloyl group in side chain; and optionally (c) reacting the hydroxyl group of the resultant polyurethane with an anhydride. The process for preparing the polyurethane of the present invention is illustrated by the following scheme:

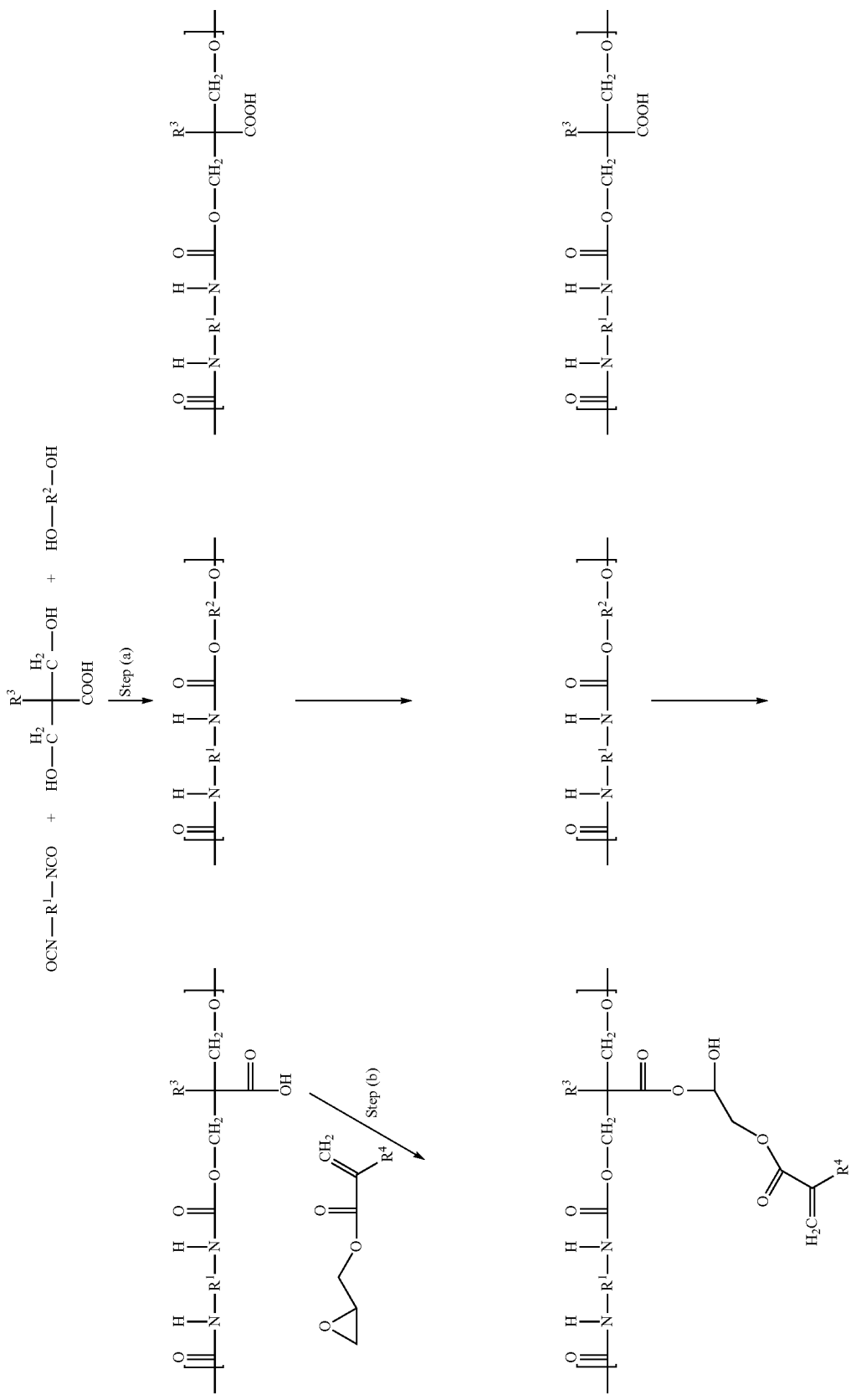

-continued
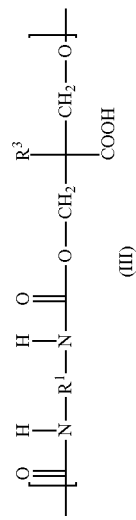
(III)
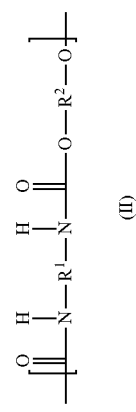
(II)
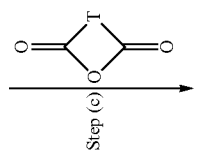
Step (c)
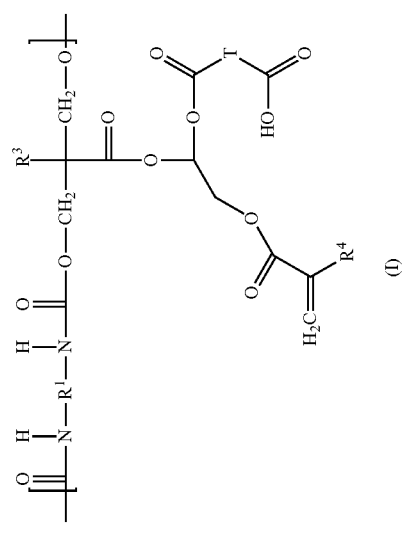
(I)

wherein:
R¹ represents a $C_{1-12}$ straight or branched alkylene group, a $C_{3-8}$ cyclic alkylene group, a phenylene group, a biphenylene group, a naphthalene group, a xylenenyl group, a divalent toludine group, a group of -Ph-A-Ph- (wherein A represents $CH_2$, —NH—, or —O—), these groups are optionally substituted with a $C_{1-6}$ alkyl group; R² represents a divalent aliphatic group which optionally has one or more OH substituents, wherein the OH substituents are optionally further reacted with a diisocyanate group; R³ represents a $C_{1-6}$ straight or branched alkyl group which optionally has one or more OH substituents, wherein the OH substituents are optionally further reacted with a diisocyanate group; B represents the groups represented by formula (IV) or (V):

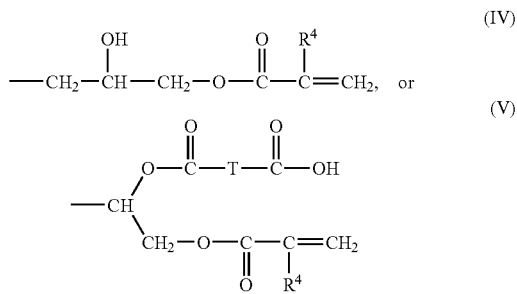

in which R⁴ represents H or $CH_3$; and
T represents one or more substituents selected from the group consisting of the following formulae:

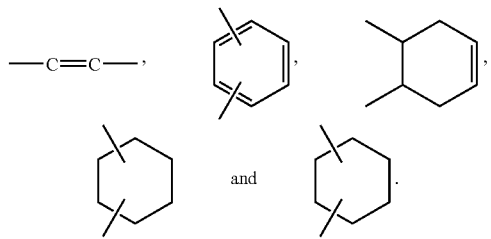

The polyurethane of the present invention has a weight molecular weight measured by GPC in a range of from 3,000 to 400,000, preferably from 6,000 to 80,000; and an acid value in a range of from 5 to 120 mgKOH/g, preferably from 10 to 60 mgKOH/g.

The present invention also relates to a radiation curable and developable photo resist composition, which comprises (A) the radiation curable and developable polyurethane (hereinafter referred to component (A)) defined as above; (B) a (meth)acrylic acid monomer (hereinafter refer to component (B)); and (C) a photo initiator (hereinafter refer to component (C)).

In the photo resist composition of the present invention, the weight ratio of the component (A) to component (B) ((A): (B)) is from 40~90:10~60, and the component (C) is in an amount of from 1~50% by weight, based on the total weight of components (A) and (B) as 100% by weight.

In the photo resist composition of the present invention, it further comprises one or more of the following additional components: adhering adjuvants (D), pigments (E), dispersants (F), and solvents (G). The amount of these additional components used in the photo resist composition of the present invention can vary in a broad range as long as they impart no adverse effect on the purposes to be achieved by the present invention.

DETAILED DESCRIPTION OF THE INVENTION

In preparing the present polyurethane (A) having a carboxy group in its main chain and a acryloyl group in its side chain and comprising the following repeat units (I), (II), and (II) in a random arrangement, the starting material diisocyanate means a compound having two isocyanate groups in one molecular. Examples of the diisocyanate include, for examples, diphenylmethane diisocyanate, 1,4-phenylene diisocyanate, 4,4'-biphenylyl diisocyante, 1,5-naphthelene diisocyanate, 4,4'-diphenylmethane diisocyanate, 2,4- or 2,6-xylenyl diisocyanate, p-toluidine diisocyanate, 4,4'-diphenyl ether diisocyanate, 1,3- or 1,4-toluene diisocyanate, 1,3-cyclopentyl diisocyanate, 1,4-cyclohexyl diisocyanate, 1,3-cyclohexyl diisocyanate, 3-isocyanate methyl-3,5,5-trimethyl-cyclohexyl isocyanate (isophorone diisocyanate), methyl-2,4-cyclohexane diisocyanate, methyl-2,6-cyclohexane diisocyanate, trimethylene diisocyanate, tetramethylene diisocyanate, hexamethylene diisocyanate, pentamethylene diisocyanate, 1,2-propylene diisocyanate, 1,2-butylene diisocyanate, 2,3-butylene diisocyanate, 1,3-butylene diisocyanate, 2,4,4- or 2,2,4-trimethyl hexamethylene diisocyanate.

In preparing the present polyurethane (A) having a carboxy group in its main chain and a acryloyl group in its side chain and comprising the following repeat units (I), (II), and (II) in a random arrangement, the starting material polyol can use the polyol having an average molecular weight of from 400~5,000. Examples of the polyol include, for examples, poly(glycol) such as polyethylene glycol, polypropylene glycol, poly tetramethylene glycol; polyester polyol such as poly (ethylene adipate)glycol, poly(butylene sebaciate)glycol, poly(hexandiol adipate)glycol, poly(3-methyl-1,5-pentylene adipate), poly(3-methyl-1,5-pentylene sebaciate)glycol, polycaprolactone glycol, and poly(β-methyl-δ-valerolactone); polycarbonate-based glycol such as poly(hexamethylene carbonate)glycol and poly(3-methyl-1,5-pentylene carbonate)glycol; polyester polycarbonate polyol; poly olefine polyol such as polyethylene polyol, polypropylene polyol, polybutylene polyol, hydrogenated product of polybutadiene polyol, polyisoprene polyol, and hydrogenated product of polyisoprene polyol.

In preparing the present polyurethane (A) having a carboxy group in its main chain and a acryloyl group in its side chain and comprising the following repeat units (I), (II), and (II) in a random arrangement, the starting material carboxylic acid having at least two hydroxyl groups can be, for examples, dimethylol propionic acid (DMAP, commercial available from Lancaster, UK), CAPA® HC 1100 (polycaprolactone having a pendent carboxylic functional group, commercial available from SOLVAY Corp. German), 2-ethylene glycol-2-methyl-2-hydroxyacetic acid.

In preparing the present polyurethane (A) having a carboxy group in its main chain and a acryloyl group in its side chain and comprising the following repeat units (I), (II), and (II) in a random arrangement, the starting material (meth)acrylate monomer having an epoxy group can be, for examples, glycidyl methacrylate (GMA, commercial available from Dow Chemical Company, US).

In preparing the present polyurethane (A) having a carboxy group in its main chain and a acryloyl group in its side chain and comprising the following repeat units (I), (II), and (II) in a random arrangement, the starting material anhydride can be, for examples, trimellitic anhydride (TMA, commercial available from Aldrich Company, US), tetrahydrophthalic anhydride (THPA, commercial available from Aldrich Company, US), succinic anhydride, and dihydrophthalic anhydride.

The present polyurethane (A) having a carboxy group in its main chain and a acryloyl group in its side chain and comprising the following repeat units (I), (II), and (II) in a random arrangement can provide the cured products with chemical resistance, heat resistance, and yellowing resistance due to its high molecular weight, high content of urethane group which is ease to form hydrogen bond, and its acryl group for irradiation curing.

The radiation curable and developable photo resist composition of the present comprises (A) the radiation curable and developable polyurethane which comprises the repeating units (I), (II), and (III); (B) a (meth)acrylic acid monomer; and (C) a photo initiator.

The polyurethane (A) used in the radiation curable and developable photo resist composition is the polyurethane as defined above.

The (meth)acrylate monomer (B) used in the radiation curable and developable photo resist composition can be, for examples, mono-, di-, tri-, or poly-(meth)acrylate monomers.

Examples of mono-(meth)acrylate include, for examples, 2-Phenoxy ethyl acrylate, tetrahydrofurfuryl acrylate, isobonyl acrylate, isobonyl methacrylate, 2-(2-ethoxythoxy)ethylacrylate, isodecyl acrylate, lauryl acrylate, and lauryl methacrylate.

Examples of di-(meth)acrylate include, for examples, tripropylene glycol diacrylate, 1,6-hexanediol diacrylate, 1,6-hexanediol dimethacrylate, dipropylene glycol diacrylate, diethylene glycol dimethacrylate, ethylene glycol dimethacrylate, triethylene glycol diacrylate, triethylene glycol dimethacrylate, tetraethylene glycol diacrylate, and tetraethylene glycol dimethacrylate.

Examples of tri-(meth)acrylate and poly(meth)acrylate include, for examples, trimethylolpropane triacrylate, trimethylolpropane trimethacrylate, di-trimethylolpropane tetraacrylate, dipentaerythritol pentacrylate, and dipentaerythritol hexaacrylate, and the like.

Such (meth)acrylate monomers can be use in one kind or combined in two or more kinds. It can be used in an amount such that the weight ratio of component (A) to component (B) is in a range of from 40~90:10~60.

The photo initiator (C) used in the radiation curable and developable photo resist composition can be any compound having active sites for pyrolysis of molecular structure to generate a free radical, a cation or an anion upon irradiation of visible light, ultraviolet light, far ultraviolet light, electron beam, and X-ray, and the like. The generated free radical, cation or anion is capable to react and polymerize with the components (A) and (B).

Examples of the photo initiator include, for example, imidazoles such as 2,2'-bis(2-chlorophenyl)-4,4',5,5'-tetrakis(4-methoxycarbonylphenyl)-1,2'-biimidazole, 2,2'-bis(2-chlorophenyl)-4,4',5,5'-tetrakis(4-ethoxy-carbonyl-phenyl)-1,2'-biimidazole, 2,2'-bis(2-chlorophenyl)-4,4',5,5'-tetrakis(4-phenoxycarbonylphenyl)-1,2'-biimaidazole, 2,2'-bis(2,4-dichloro-phenyl)-4,4',5,5'-tetrakis(4-methoxycarbonylphenyl)-1,2'-biimidazole, 2,2'-bis(2,4-dichlorophenyl)-4,4',5,5'-tetrakis(4-ethoxy-carbonylphenyl)-1,2'-biimidazole, 2,2'-bis(2,4-dichlorophenyl)-4,4',5,5'-tetrakis(4-phenoxycarbonylphenyl)-1,2'-biimidazole, 2,2'-bis(2,4,6-trichlorophenyl)-4,4',5,5'-tetrakis(4-methoxycarbonylphenyl)-1,2'-biimidazole, 2,2'-bis(2,4,6-trichlorophenyl)-4,4',5,5'-tetrakis(4-ethoxy-carbonylphenyl)-1,2'-biimidazole, 2,2'-bis(2,4,6-trichlorophenyl)-4,4',5,5'-tetrakis(4-phenoxycarbonylphenyl)-1,2'-biimidazole, 2,2'-bis(2-bromophenyl)-4,4',5,5'-tetrakis(4-methoxycarbonylphenyl)-1,2'-biimidazole, 2,2'-bis(2-bromophenyl)-4,4',5,5'-tetrakis(4-ethoxycarbonylphenyl)-1,2'-biimidazole, 2,2'-bis(2-bromophenyl)-4,4',5,5'-tetrakis(4-phenoxy-carbonylphenyl)-1,2'-biimidazole, 2,2'-bis(2,4-dibromophenyl)-4,4',5,5'-tetrakis(4-methoxycarbonylphenyl)-1,2'-biimidazole, 2,2'-bis(2,4-dibromophenyl)-4,4',5,5'-tetrakis(4-ethoxycarbonylphenyl)-1,2'-biimidazole, 2,2'-bis(2,4-dibromophenyl)-4,4',5,5'-tetrakis(4-phenoxy-carbonylphenyl)-1,2'-biimidazole, 2,2'-bis(2,4,6-tribromophenyl)-4,4',5,5'-tetrakis(4-methoxycarbonylphenyl)-1,2'-biimidazole, 2,2'-bis-(2,4,6-tribromophenyl)-4,4',5,5'-tetrakis(4-ethoxycarbonylphenyl)-1,2'-biimidazole, 2,2'-bis-(2,4,6-tribromophenyl)-4,4',5,5'-tetrakis(4-phenoxy-carbonylphenyl)-1,2'-biimidazole, 2,2'-bis(2-cyanophenyl)-4,4',5,5'-tetrakis(4-methoxycarbonylphenyl)-1,2'-biimidazole, 2,2'-bis(2-cyano-phenyl)-4,4',5,5'-tetrakis(4-ethoxycarbonylphenyl)-1,2'biimidazole, 2,2'-bis(2-cyanophenyl)-4,4',5,5 '-tetrakis(4-phenoxycarbonylphenyl)-1,2'-biimidazole, 2,2'-bis(2-methylphenyl)-4,4',5,5'-tetrakis(4-methoxy-carbonylphenyl)-1,2'-biimidazole, 2,2'-bis(2-methylphenyl)-4,4',5,5'-tetrakis(4-ethoxycarbonylphenyl)-1,2'-biimidazole, 2,2'-bis(2-methyl-phenyl)-4,4',5,5'-tetrakis(4-phenoxycarbonylphenyl)-1,2'-biimidazole, 2,2'-bis(2-ethyl-phenyl)-4,4', 5,5'-tetrakis(4-methoxycarbonylphenyl)-1,2'-biimidazole, 2,2'-bis(2-ethylphenyl)-4,4',5,5'-tetrakis(4-ethoxycarbonylphenyl)-1,2'-biimidazole, 2,2'-bis(2-ethylphenyl)-4,4',5,5'-tetrakis(4-phenoxycarbonylphenyl)-1,2'-biinidazole, 2,2'-bis(2-phenylphenyl)-4,4',5,5'-tetrakis(4-methoxycarbonylphenyl)-1,2'-biimidazole, 2,2'-bis(2-phenylphenyl)-4,4',5,5'-tetrakis(4-ethoxycarbonylphenyl)-1,2'-biimidazole, 2,2'-bis-(2-phenylphenyl)-4,4',5,5'-tetrakis(4-phenoxy-carbonylphenyl)-1,2'-biimidazole, 2,2'-bis(2-chlorophenyl)-4,4',5,5'-tetraphenyl-1,2'-biimidazole, 2,2'-bis(2,4-dichlorophenyl)-4,4',5,5'-tetraphenyl-1,2'-biimidazole,- 2,2'-bis(2,4,6-trichlorophenyl)-4,4',5,5'-tetraphenyl-1,2'-biimidazole, 2,2'-bis(2-bromophenyl)-4,4',5,5'-tetraphenyl-1,2'-biimidazole, 2,2'-bis(2,4-dibromophenyl)-4,4',5,5'-tetraphenyl-1,2'-biimidazole, 2,2'-bis(2,4,6-tribromophenyl)-4,4',5,5'-tetraphenyl-1,2'-biimidazole, 2,2'-bis(2-cyanophenyl)-4,4',5,5'-tetraphenyl-1,2'-biimidazole, 2,2'-bis(2,4-dicyanophenyl)-4,4',5,5'-tetraphenyl-1,2'-biimidazole, 2,2'-bis(2,4,6-tricyanophenyl)-4,4',5,5'-tetraphenyl-1,2'-biimidazole, 2,2'-bis(2-methylphenyl)-4,4',5,5'-tetraphenyl-1,2'-biimidazole, 2,2'-bis(2,4-dimethylphenyl)-4, 4',5,5'-tetraphenyl-1,2'-biimidazole, 2,2'-bis(2,4,6-trimethylphenyl)-4,4',5,5'-tetraphenyl-1,2'-biimidazole, 2,2'-bis(2-ethylphenyl)-4,4',5,5'-tetraphenyl-1,2'-biimidazole, 2,2'-bis(2,4-diethylphenyl)-4,4',5,5'-tetraphenyl-1,2'-biimidazole, 2,2'-bis(2,4,6-triethylphenyl)-4,4',5,5'-tetraphenyl-1, 2'-biimidazole, 2,2'-bis(2-phenylphenyl)-4,4',5,5'-tetraphenyl-1,2'-bi-imidazole, 2,2'-bis(2,4-diphenylphenyl)-4,4',5,5'-tetraphenyl-1,2'-bi-imidazole, and 2,2'-bis(2,4,6-triphenylphenyl)-4,4',5,5'-tetraphenyl-1,2'-biimidazole; and the like; among them, 2,2'-bis(2-chlorophenyl)-4,4',5,5'-tetrakis(4-ethoxycarbonylphenyl)-1,2'-biimidazole, 2,2'-bis(2-bromophenyl)-4,4',5,5'-tetrakis(4-ethoxycarbonylphenyl)-1, 2'-biimidazole, 2,2'-bis(2,4-dichlorophenyl)-4,4',5,5'-tetraphenyl-1,2'-biimidazole, 2,2'-bis-(2,4,6-trichlorophenyl)-4,4',5,5'-tetraphenyl-1,2'-biimidazole, 2,2'-bis(2,4-dibromophenyl)-4,4',5,5'-tetraphenyl-1,2'-biimidazole, and 2,2'-bis(2,4,6-tribromophenyl)-4,4',5,5'-tetraphenyl-1,2'-biimidazole are preferable;

benzoins such as benzoin, benzoin methyl ether, benzoin ethyl ether, benzoin i-propyl ether, benzoin i-butyl ether, methyl-2-benzoyl benzoate, and the like;

acetophenones such as 2,2-dimethoxy-2-phenylacetophenone, 2-hydroxy-2-methyl-1-phenylpropan-1-one, 1-(4-i-propylphenyl)-2-hydroxy-2-methylpropan-1-one, 4-(2-hydroxyethoxy)phenyl-(2-hydroxy-2-propyl)kettone, 2,2-dimethoxyacetophenone, 2,2-diethoxyacetophenone, 2-methyl-(4-methylthiophenyl)-2-morpholino-1-propan-1-one, 2-benzyl-2-dimethylamino-1-(4-morpholinophenyl)butan-1-one, 1-hydroxycyclohexylphenyl ketone, 2,2'-dimethoxy-1,2-diphenylethan-1-one, 4-azidoacetophenone, and 4-azidobenzalacetophenone, and the like;

benzophenone such as benzophenone, 4,4'-bis(dimethylamino)benzophenone, 4,4'-bis(diethylamino)benzophenone, 3,3'-dimethyl-4-methoxybenzophenone, and the like;

alpha-diketones such as diacetyl, dibenzoyl, methylbenzoyl formate, and the like;

polynuclear quinones such as anthraquinone, 2-ethylanthraquinone, 2-t-butylanthraquinone, 1,4-naphthoquinone, and the like;

xanthones such as xanthone, thioxanthone, 2,4-diethylthioxanthone, 2-chlorothioxanthone, and the like;

diazo compounds such as 4-diazodiphenylamine, 4-diazo-4'-methoxydiphenylamine, 4-diazo-3-methoxydiphenylamine, and the like;

triazines such as 2-(2'-furylethylidene)-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(2'-bromo-4'-methylphenyl)-4,6-bis(trichloromethyl)-s-triazine, 2-(2'-thiophenylethylidene)-4,6-bis(trichloromethyl)-s-triazine, and the like.

In addition to those listed above, examples of the photo initiator further include 4-azidobenzaldehyde, azidopyrene, bis(2,6-dimethoxybenzoyl)-2,4,4-trimethylpentylphosphine oxide, N-phenylthioacridone, triphenylpyrylium perchlorate, and the like.

The photo initiator (C) can be use in one kind or combined in two or more kinds and can be used in an amount of 1~50% by weight, based on the total weight ratio of components (A) and (B) as 100% by weight.

The radiation curable and developable photo resist composition of the present invention can further comprise adhering adjuvants (D). Examples of the adhering adjuvants include silanes having a vinyl functional group such as vinyltrichlorosilane, vinyltrimethoxysilane, and vinyltriethoxysilane; silanes having an epoxy functional group such as 2-(3,4-epoxycyclohexyl)-ethyltrimethoxysilane, 3-glycidoxypropyltrimethoxysilane, 3-glycidoxypropylmethyldiethoxysilane, and 3-glycidoxypropyltriethoxysilane; silanes having a methacryloxy functional group such as 3-methacryloxypropylmethyldimethoxysilane, 3-methacryloxypropyltrimethoxysilane, 3-methacryloxypropylmethyldiethoxysilane, 3-methacryloxypropyltriethoxysilane, and the like; silanes having an acryloxy functional group such as 3-acryloxypropyltrimethoxysilane and the like; silanes having an amino functional group such as N-2(aminoethyl)3-aminopropylmethyldimethoxysilane, N-2(aminoethyl)3-aminopropyltrimethoxysilane, N-2(aminoethyl)3-aminopropyltriethoxysilane, 3-aminopropyltrimethoxysilane, 3-aminopropyltriethoxysilane, 3-triethoxysilyl-N-(1,3-dimethyl-butyliden)propylamine, N-phenyl-3-aminopropyltrimethoxysilane, N-(vinylbenzyl)-2-aminoethyl-3-aminopropyltrimethoxysilane hydrochloride, and the like; silanes having a ureido functional group such as 3-ureidopropyltriethoxysilane and the like; silanes having a chloropropyl functional group such as 3-chloropropyltrimethoxysilane and the like; silanes having a mercapto functional group such as 3-mercaptopropylmethyldimethoxysilane, 3-mercaptopropyltrimethoxysilane, and the like; silanes having a sulfido functional group such as bis(triethoxysilylpropyl)tetrasulfide and the like; silanes having an isocyanate functional group such as 3-isocyanatepropyltriethoxysilane and the like.

The adhering adjuvants (D) can be use in one kind or combined in two or more kinds and can be used in an amount of 0.1~5% by weight, based on the total weight ratio of components (A) and (B) as 100% by weight.

The radiation curable and developable photo resist composition of the present invention can further comprise pigments (E). Examples of the pigments include C.I. Pigment Yellow 83, C.I. Pigment Yellow 110, C.I. Pigment Yellow 138, C.I. Pigment Yellow 139, C.I. Pigment Yellow 150, and C.I. Pigment Yellow 155; C.I. Pigment Orange 71; C.I. Pigment Violet 19 and C.I. Pigment Violet 23; C.I. Pigment Red 48:1, C.I. Pigment Red 48:2, C.I. Pigment Red 48:3, C.I. Pigment Red 48:4, C.I. Pigment Red 122, C.I. Pigment Red 177, C.I. Pigment Red 202, C.I. Pigment Red 206, C.I. Pigment Red 207, C.I. Pigment Red 209, C.I. Pigment Red 224, and C.I. Pigment Red 254; C.I. Pigment Blue 15:3, C.I. Pigment Blue 15:4, and C.I. Pigment Blue 15:6; C.I. Pigment Green 7 and C.I. Pigment Green 36; C.I. Pigment Brown 23 and C.I. Pigment Brown 25; C.I. Pigment Black 1 and C.I. Pigment Black 7; and the like. C.I. is regulated and published by The Society of Dyers and Colorists Co. The pigments (E) can be use in one kind or combined in two or more kinds and can be used in an amount of 70~600% by weight, based on the total weight ratio of components (A) and (B) as 100% by weight.

The radiation curable and developable photo resist composition of the present invention can further comprise dispersants (F). Examples of the dispersants include S32000 (commercial available from Avecia Company, US; an cationic amide surfactant produced by reacting a poly(alkylene imine) and hydroxylstearate having free hydroxyl group). By combining the dispersant into the photo resist composition of the present invention, it can facilitate the homogeneous dispersing of the pigment when grinding by sand wheel mill. The dispersants (F) can be used in an amount of 3~15% by weight, based on the total weight ratio of components (A) and (B) as 100% by weight.

The radiation curable and developable photo resist composition of the present invention can comprise solvents (G), if necessary. The solvents are used for maintaining the composition as liquid state and obtaining an appropriate viscosity of the composition suitable for spraying. The solvents can use any one as long as they can dissolve or disperse the necessary components, would not reacte therewith, and possesses an appropriate volatility.

Examples of the solvents include (poly)alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol mononiethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; (poly)alkylene glycol monoalkyl ether acetates such as ethylene glycol monomethyl ether acetate, ethylene glycol monoethyl ether acetate, propylene glycol monomethyl ether acetate, and propylene glycol monoethyl ether acetate; diethylene glycol dimethyl ether, diethylene glycol methylethyl ether, diethylene glycol diethyl ether, and tetrahydrofuran; ketones such as methyl ethyl ketone, cyclohexanone, 2-heptanone, and 3-heptanone; alkyl lactates such as methyl 2-hydroxypropionic acid and ethyl 2-hydroxypropionic acid; esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanate, 3-methyl-3-methoxybutyl acetate, 3-methyl-3-methoxybutyl propionate, ethyl acetate, n-butyl acetate, i-butyl acetate, n-amyl formate, i-amyl acetate, n-butyl propionate, i-propyl butyrate, ethyl butyrate, n-butyl butyrate, methyl pyruvate, ethyl pyruvate, n-propyl pyruvate, methyl acetoacetate, ethyl acetoacetate, and ethyl 2-oxobutanate; aromatic hydrocarbons such toluene and xylene; amides such as N-methylpyrrolidone, N,N-dimethylformamide, and N,N-dimethylacetoamide, and the like.

The solvents (G) can be use in one kind or combined in two or more kinds. Although the solvents can be used in any amount as long as it can provide the desired viscosity, it is usually used in an amount of 200~2500% by weight, based on the total weight ratio of components (A) and (B) as 100% by weight. The term "amount of the solvents" used herein means the total weight of the solvent extra added and the solvents originally existed in the polyurethane (A) and the pigments (E).

The present invention will be further illustrated by reference to the following synthesis examples and working examples. However, these synthesis examples and working examples are not intended to limit the scope of the present invention but only describe the preferred embodiments of the present invention.

EXAMPLES

In the following Examples, diphenylmethane diisocyanate (MDI) is commercial available from BASF Corporation; polyethylene glycol (PPG) is a product under a trade name PPG-1000 commercial available from En Hou Polymer Chemical Industrial Co., Ltd, Taiwan, it has a molecular weight of 1000 grams/mole; polycaprolactone diol (PCL Diol) is a product under a trade name of CAPA® 2101A commercial available from SOLVAY Chemicals, it has a molecular weight of 1000 grams/mole and a hydroxyl number of about 110 mgKOH/g; polycarbonate diol (PC diol) is a product under a trade name of PC-diol-1000 commercial available from Asahi Kasei Corporation, it has a molecular weight of 1000 grams/mole and a hydroxyl number of from 100~120 mgKOH/g; polytetramethylene-ether-glycol (PTMEG) is a product under a trade name of PTMEG-1000 commercial available from BASF Corporation, it has a molecular weight of 1000 grams/mole and a hydroxyl number of 107~118 mgKOH/g; diol having one carboxyl functional group is dimethylol propionic acid (DMPA) commercial available from Lancaster; diol having one carboxyl functional group is a product under a trade name of CAPA® HC1100 commercial available from SOLVAY Chemicals, it has a molecular weight of 1000 grams/mole, a hydroxyl number of about 110 mgKOH/g, and a carboxyl number of less than 60 mgKOH/g; acrylate monomer having one epoxy group is glycidiyl methacrylate (GMA) commercial available from Dow Chemical Company, it has a molecular weight of 142 grams/mole; and anhydride compound is tetrahydrophthalic anhydride (THPA) commercial available from Aldrich Chemical Company Inc.; and another anhydride is trimellitic anhydride (TMA) also commercial available from Aldrich Chemical Company Inc.; solvent propylene glycol monomethyl ether acetate (PMA) is commercial available from DOW Chemical Company; another solvent N-methyl-2-pyrrolidone (NMP) is commercial available from BASF Corporation.

Example 1

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams PPG-1000 (molecular weight=1000) were mixed in 50 grams NMP to obtain a mixture B and then added dropwise into the mixture A. After completing the addition, the resultant mixture was monitored by FTIR to determine whether the isocyanate (NCO) groups were reacted completely. After completing the reaction, the temperature of the mixture was increased to 100° C. and was added with 8.3 grams GMA while maintaining at the same temperature until the acid number of the resultant solution reached 18 mg KOH/g, at which time the reaction was completed to obtain a curable and developable polyurethane 1 which was consisting of the following repeating units in a random arrangement and has a Mw of 16,500 determined by GPC (Gel Permeation Chromatography).

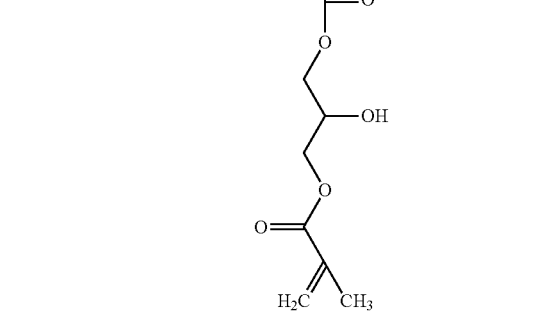

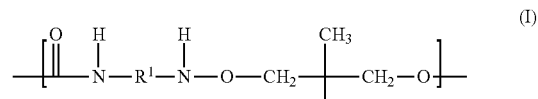

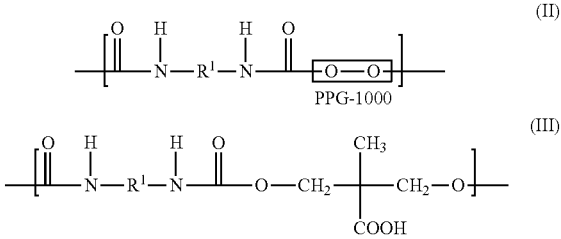

wherein

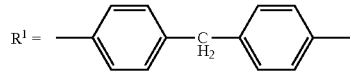

Example 2

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams CAPA® 2101A (molecular weight=1000) were mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and was added with 8.3 grams GMA while maintaining at the same temperature until the acid number of the resultant solution reached 18 mg KOH/g, at which time the reaction was completed to obtain a curable and developable polyurethane 2 which has a Mw of 23,700 determined by GPC.

Example 3

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams PC-diol (molecular weight=1000) were mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and was added with 8.3 grams GMA while maintaining at the same temperature until the acid number of the resultant solution reached 18 mg KOH/g, at which time the reaction was completed to obtain a curable and developable polyurethane 3 which has a Mw of 20,500 determined by GPC.

Example 4

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams PTMEG (molecular weight=1000) were mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and was added with 8.3 grams GMA while maintaining at the same temperature until the acid number of the resultant solution reached 18 mg KOH/g, at which time the reaction was completed to obtain a curable and developable polyurethane 4 which has a Mw of 18,500 determined by GPC.

Example 5

16.79 grams MDI and 112.5 grams PMA were added into a 500 mL four-neck separable reactor and the temperature was increased to 60° C. with stirring by using a mechanical stirrer until MDI was dissolved completely to obtain a mixture A. Separately, 70.71 grams CAPA® HC1100 (molecular weight=1000) was mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and was added with 8.3 grams GMA while maintaining at the same temperature until the acid number of the resultant solution reached 12 mg KOH/g, at which time the reaction was completed to obtain a curable and developable polyurethane 5 which has a Mw of 24,500 determined by GPC.

Examples 6 to 9

The polyurethanes 1 to 4 prepared in Examples 1 to 4 were each mixed thoroughly with the components and the amounts listed in Table 1 and then ground uniformly by using a sand wheel mill with addition of an appropriate dispersant to control the particle size of the resultant composition to not more than 200 nm to obtain photo resist compositions Nos. 1, 2, 3, and 4.

TABLE 1

|  |  | Example 6 Photo resist composition No. 1 | Example 7 Photo resist composition No. 2 | Example 8 Photo resist composition No. 3 | Example 9 Photo resist composition No. 4 |
|---|---|---|---|---|---|
| Polyurethane 1 | (A) | 67 | — | — | — |
| Polyurethane 2 |  | — | 67 | — | — |
| Polyurethane 3 |  | — | — | 67 | — |
| Polyurethane 4 |  | — | — | — | 67 |
| TPGDA | (B) | 33 | 33 | 33 | 33 |
| Igacure 907 | (C) | 16.7 | 16.7 | 16.7 | 16.7 |
| KBM503 | (D) | 3.3 | 3.3 | 3.3 | 3.3 |
| C.I. Pigment Green 36 | (E) | 150 | 150 | 150 | 150 |
| S32000 | (F) | 10 | 10 | 10 | 10 |
| PMA | (G) | 800 | 800 | 800 | 800 |
| Viscosity (cps/25° C.) |  | 5~15 | 5~15 | 5~15 | 5~15 |

Note:
The amounts in the Table 1 were based on that total weight of the components (A) and (B) as 100% by weight and components (C), (D), (E), (F), and (G) are each calculated relative to the total weight of the components (A) and (B) as 100% by weight.
TPGDA: tripropylene glycol diacrylate manufactured by AGI Corporation, Taiwan
KBM503: 3-methacryoyloxypropyl triethoxy silane commercial available from Shin-Etsu Chemical Co., Ltd.
Igacure 907: 2-methyl-(4-methylthienyl)-2-morphline-propane-1-one commercial available from Ciba Specialty Chemicals
S32000: dispersant commercial available Avecia Fine Chemicals Ltd.
PMA: propylene glycol monomethyl ether acetate

Experimental Example 1

Test for Chemical Resistance, Heat Resistance, and Yellowing Resistance

Each photo resist compositions Nos. 1~4 was coated on a glass substrate into a film at a thickness of from 1~3 μm. The resist-coated substrates were pre-baked at a temperature of from 70~110° C. for 100~300 seconds, exposed with UV light at a dose of 50~200 mJ/cm$^2$, developed with NaOH solution for 20~150 seconds, and then post-baked at a temperature of from 200~250° C. for 20~40 minutes. The resultant substrates were each immersed in various solvents (80° C. water; propylene glycol monomethyl ether (PM), N-methylpyrrolidine (NMP), 2.38% ammonium tetramethyl hydroxide (TMAH) solution) for 5~20 minutes (i.e. chemical resistance test), respectively. Also, the resultant substrates were exposed in various conditions (170° C. in air, 10 hours; i.e. heat resistance test), and determined their yellowing resistance in term of ΔE*ab. The results are summarized in Table 2.

TABLE 2

|  | Photo resist composition No. 1 | Photo resist composition No. 2 | Photo resist composition No. 3 | Photo resist composition No. 4 |
|---|---|---|---|---|
| Water at 80° C. | 2.13 | 1.53 | 1.71 | 2.04 |
| PM | 1.86 | 1.03 | 1.30 | 1.76 |
| NMP | 2.31 | 1.02 | 1.86 | 2.15 |
| TMAH 2.38% | 1.97 | 0.94 | 1.03 | 1.67 |
| Air at 170° C. | 1.25 | 0.62 | 0.86 | 0.95 |

Note:
The ΔE*ab value showing coloring was obtained from the difference between the color value before test and after test by using spectrophotometric measurements, MCPD3000, manufactured by Otsuka Electrics-Corp (color difference ΔE*ab was quantitative analyzed based on CIE L*a*b* system).

From the above results, it showed that although the polyurethane 1 of Example 1 was present in the photo resist composition 1 in an amount of up to 10 wt %, they provided excellent heat resistance, chemical resistance, yellowing resistance (i.e. ΔE*ab≦3) due to the more urethane groups (for providing more hydrogen bonds) and acrylic group contained in the polyurethane 1.

Example 10

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams PPG-1000 (molecular weight=1000) were mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and added with 8.3 grams GMA while maintaining at the same temperature until the acid number of the resultant solution reached 18 mg KOH/g. Then 6.7 grams TMA were added into the solution and the temperature was increased to 110° C. for 1 hour, at which time the reaction was completed to obtain a curable and developable polyurethane 6 which acid number was about 39 mg KOH/g, was consisting of the following repeating units in a random arrangement, and has a Mw of 8,700 determined by GPC.

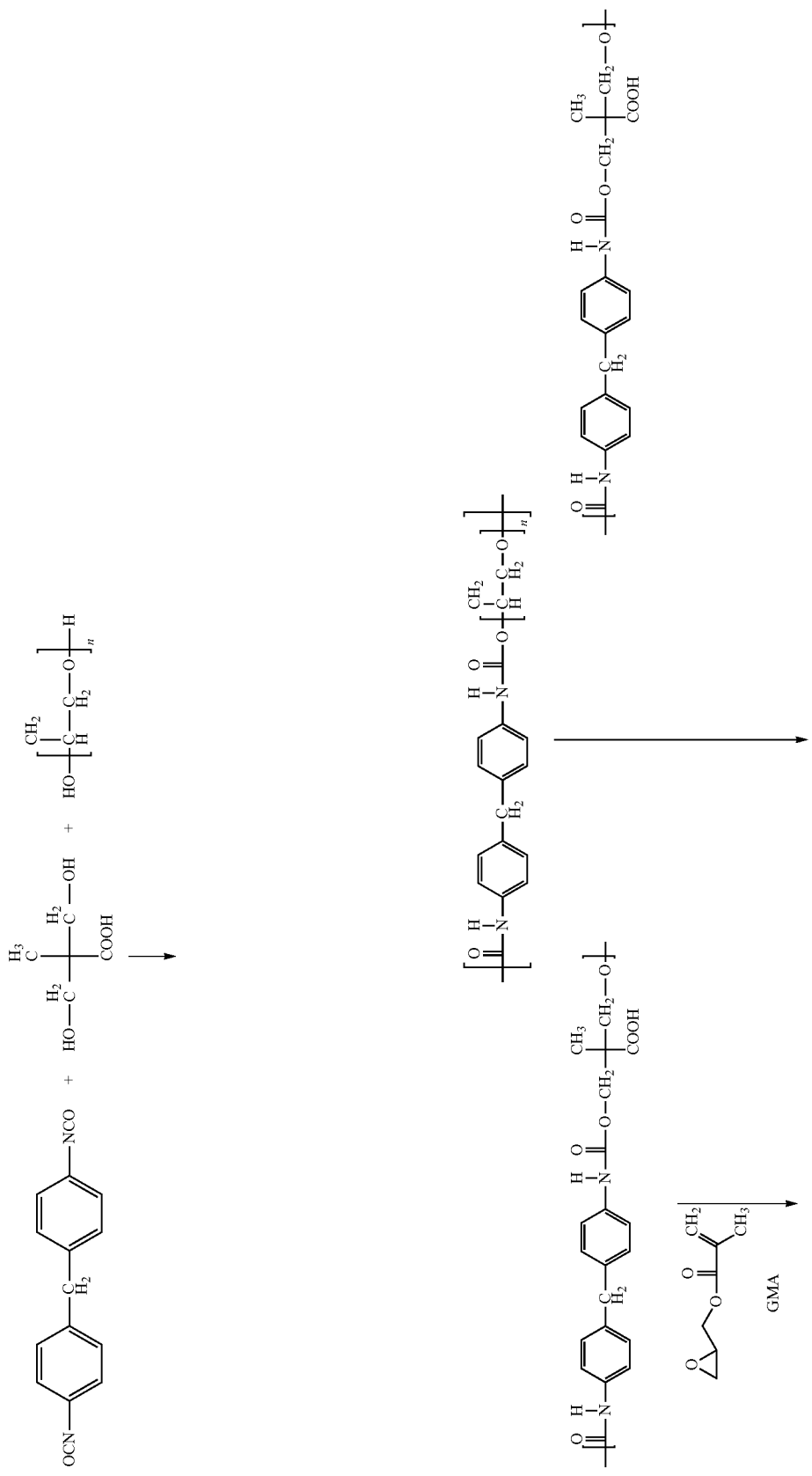

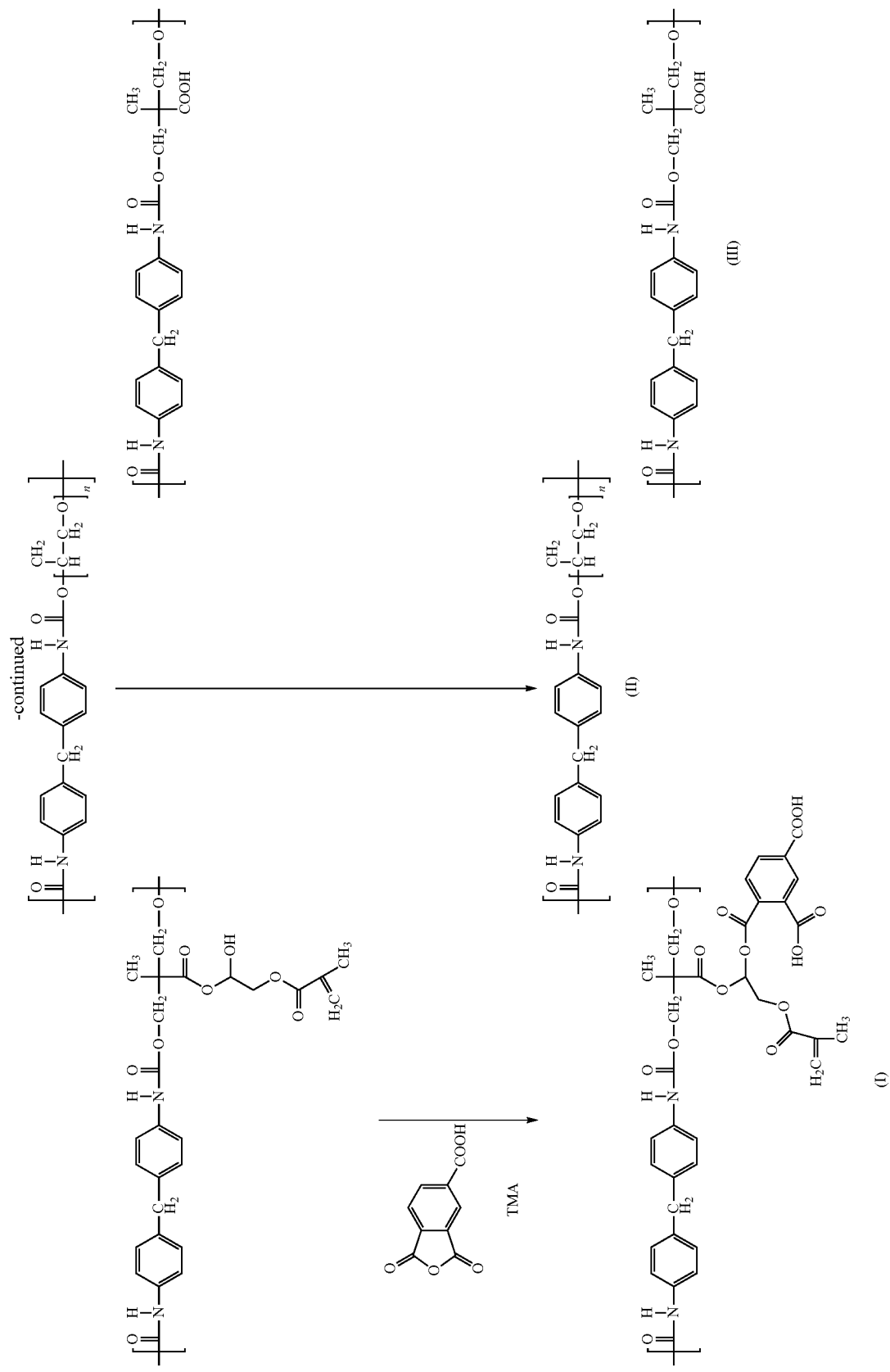

Example 11

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams CAPA® 2101A (molecular weight=1000) were mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and added with 8.3 grams GMA while maintaining at the same temperature until the acid number of the resultant solution reached 18 mg KOH/g. Then 6.7 grams TMA were added into the solution and the temperature was increased to 110° C. for 1 hour, at which time the reaction was completed to obtain a curable and developable polyurethane 7 which acid number was about 39 mg KOH/g and has a Mw of 23,000 determined by GPC.

Example 12

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams PC-diol (molecular weight=1000) were mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and added with 8.3 grams GMA while maintaining at the same temperature until the acid number of the resultant solution reached 18 mg KOH/g. Then 6.7 grams TMA were added into the solution and the temperature was increased to 110° C. for 1 hour, at which time the reaction was completed to obtain a curable and developable polyurethane 8 which acid number was about 39 mg KOH/g and has a Mw of 45,000 determined by GPC.

Example 13

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams PTMEG (molecular weight=1000) were mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and added with 8.3 grams GMA while maintaining at the same temperature until the acid number of the resultant solution reached 18 mg KOH/g. Then 6.7 grams TMA were added into the solution and the temperature was increased to 110° C. for 1 hour, at which time the reaction was completed to obtain a curable and developable polyurethane 9 which acid number was about 39 mg KOH/g and has a Mw of 68,000 determined by GPC.

Example 14

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams PPG-1000 (molecular weight=1000) were mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and added with 8.3 grams GMA while maintaining at the same temperature until the acid number of the resultant solution reached 18 mg KOH/g. Then 5.3 grams THPA were added into the solution and the temperature was increased to 110° C. for 1 hour, at which time the reaction was completed to obtain a curable and developable polyurethane 10 which acid number was about 29 mg KOH/g, was consisting of the following repeating units in a random arrangement, and has a Mw of 11,000 determined by GPC.

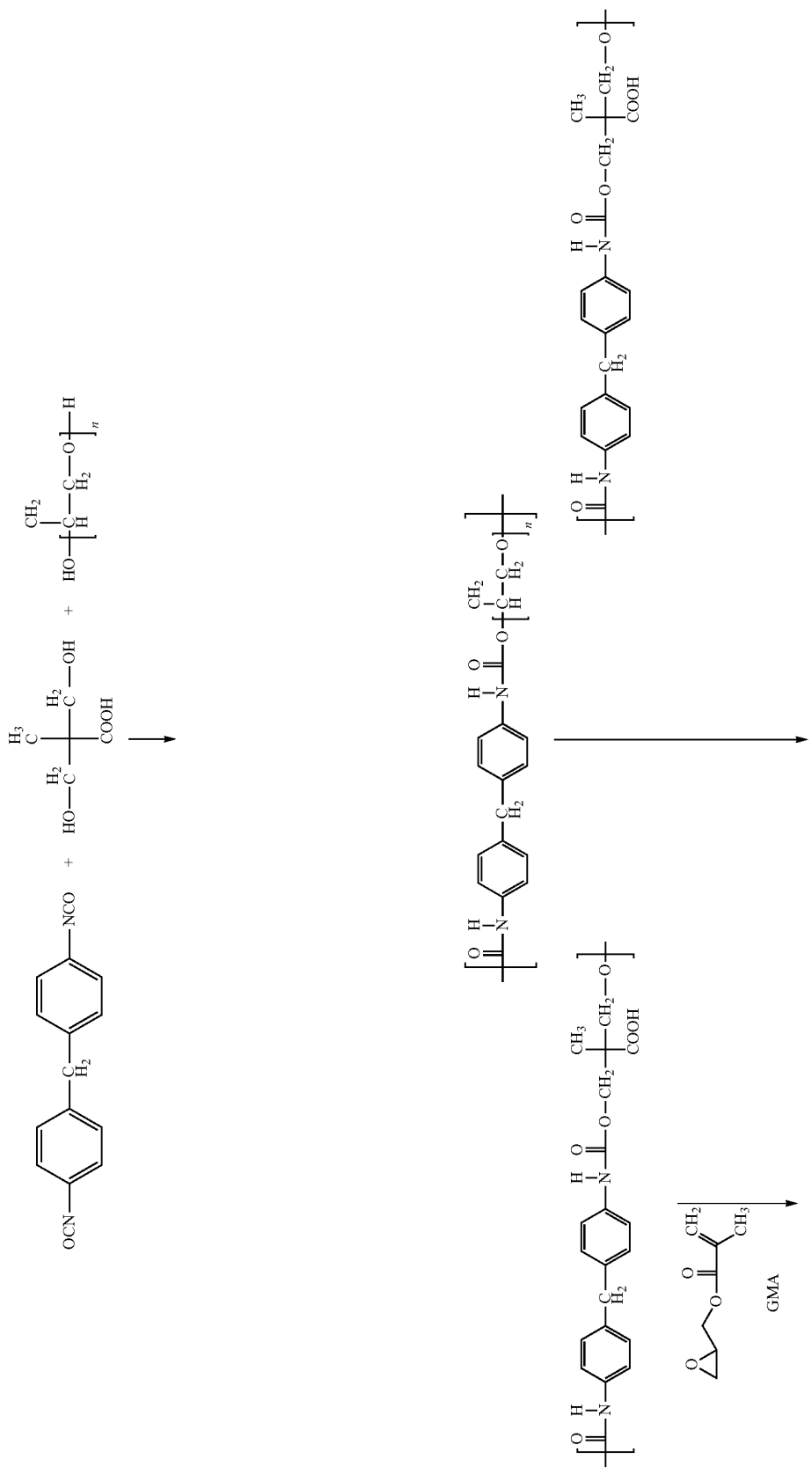

-continued
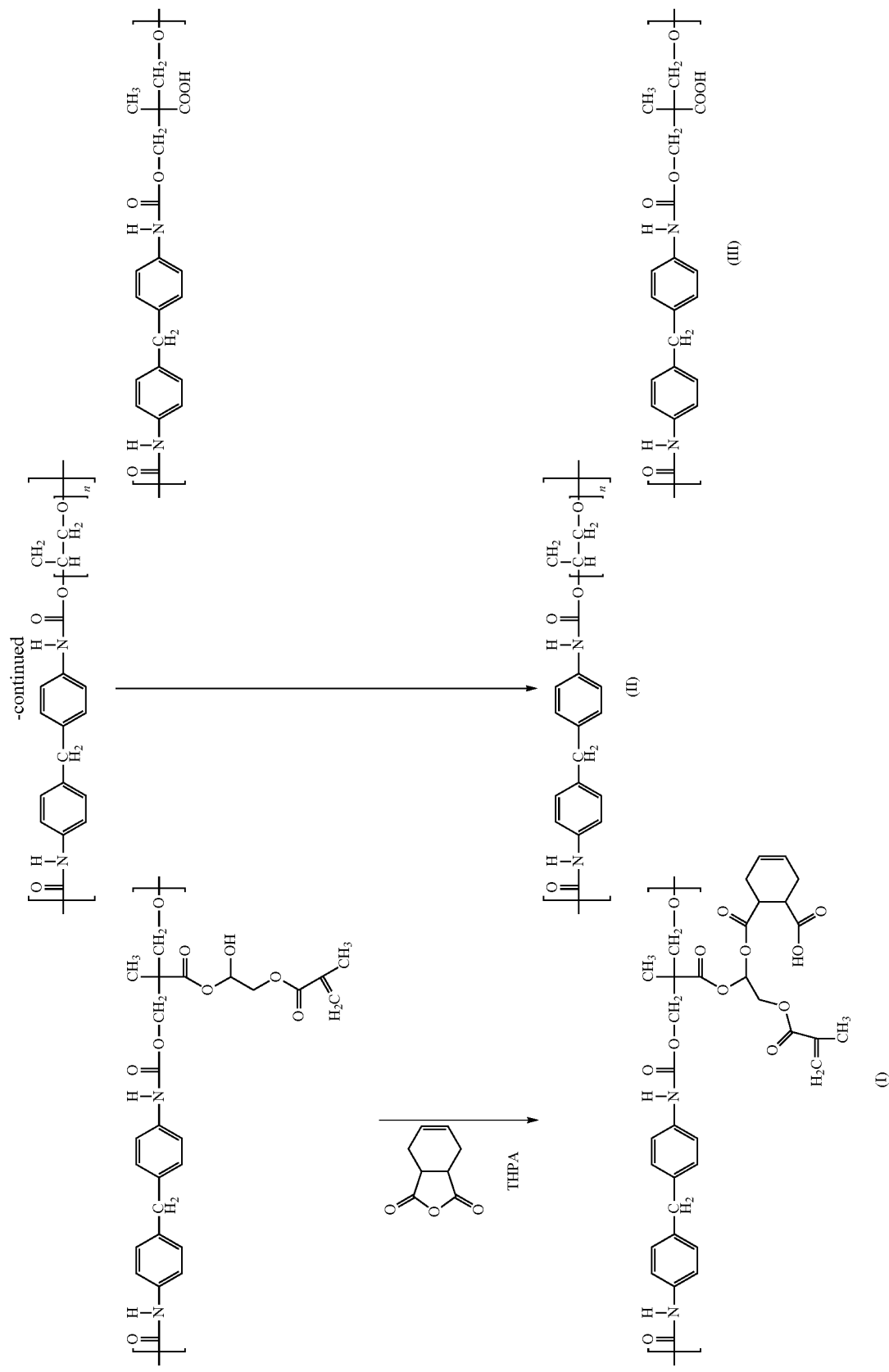

Example 15

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams CAPA® 2101A (molecular weight=1000) were mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and added with 8.3 grams GMA while maintaining at the same temperature until the acid number of the resultant solution reached 18 mg KOH/g. Then 5.3 grams THPA were added into the solution and the temperature was increased to 110° C. for 1 hour, at which time the reaction was completed to obtain a curable and developable polyurethane 11 which acid number was about 29 mg KOH/g and has a Mw of 28,500 determined by GPC.

Example 16

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams PC-diol (molecular weight=1000) were mixed in 50 grams NMP to obtain a mixture B and then added dropwise into the mixture A. After completing the addition, the resultant mixture was monitored by FTIR to determine whether the NCO groups were reacted completely. After completing the reaction, the temperature of the mixture was increased to 100° C. and added with 8.3 grams GMA while maintaining at the same temperature until the acid number of the resultant solution reached 18 mg KOH/g. Then 5.3 grams THPA were added into the solution and the temperature was increased to 110° C. for 1 hour, at which time the reaction was completed to obtain a curable and developable polyurethane 12 which acid number was about 29 mg KOH/g and has a Mw of 43,000 determined by GPC.

Example 17

31.9 grams MDI and 80 grams PMA were added into a 500 mL four-neck separable reactor and the temperature was increased to 60° C. with stirring by using a mechanical stirrer until MDI was dissolved completely to obtain a mixture A. Separately, 16.2 grams DMPA and 13.6 grams PTMEG (molecular weight=1000) were mixed in 50 grams NMP to obtain a mixture B and then added dropwise into the mixture A. After completing the addition, the resultant mixture was monitored by FTIR to determine whether the NCO group was reacted completely. After completing the reaction, the temperature of the mixture was increased to 100° C. and added with 8.3 grams GMA while maintaining at the same temperature until the acid number of the resultant solution reached 18 mg KOH/g. Then 5.3 grams THPA were added into the solution and the temperature was increased to 110° C. for 1 hour, at which time the reaction was completed to obtain a curable and developable polyurethane 13 which acid number was about 29 mg KOH/g and has a Mw of 59,000 determined by GPC.

Examples 18 to 25

The polyurethanes 6 to 13 prepared in Examples 10 to 17 respectively were each mixed thoroughly with the components and the amounts listed in Tables 3 and 4, and then ground uniformly by using a sand wheel mill with addition of an appropriate dispersant to control the particle size of the resultant composition to not more than 200 nm to obtain photo resist compositions Nos. 6 to 13.

TABLE 3

|  |  | Example 18 Photo resist composition 6 | Example 19 Photo resist composition 7 | Example 20 Photo resist composition 8 | Example 21 Photo resist composition 9 |
|---|---|---|---|---|---|
| Polyurethane 6 | (A) | 67 | — | — | — |
| Polyurethane 7 |  | — | 67 | — | — |
| Polyurethane 8 |  | — | — | 67 | — |
| Polyurethane 9 |  | — | — | — | 67 |
| TPGDA | (B) | 33 | 33 | 33 | 33 |
| Igacure 907 | (C) | 16.7 | 16.7 | 16.7 | 16.7 |
| KBM503 | (D) | 3.3 | 3.3 | 3.3 | 3.3 |
| C.I. Pigment Green 36 | (E) | 150 | 150 | 150 | 150 |
| S32000 | (F) | 10 | 10 | 10 | 10 |
| PMA | (G) | 800 | 800 | 800 | 800 |
| Viscosity (cps/25° C.) |  | 5.7 | 8.1 | 11.5 | 14.6 |

TABLE 4

|  |  | Example 22 Photo resist composition 10 | Example 24 Photo resist composition 11 | Example 23 Photo resist composition 12 | Example 25 Photo resist composition 13 |
|---|---|---|---|---|---|
| Polyurethane 10 | (A) | 67 | — | — | — |
| Polyurethane 11 |  | — | 67 | — | — |
| Polyurethane 12 |  | — | — | 67 | — |
| Polyurethane 13 |  | — | — | — | 67 |

TABLE 4-continued

|  |  | Example 22 Photo resist composition 10 | Example 24 Photo resist composition 11 | Example 23 Photo resist composition 12 | Example 25 Photo resist composition 13 |
|---|---|---|---|---|---|
| TPGDA | (B) | 33 | 33 | 33 | 33 |
| Igacure 907 | (C) | 16.7 | 16.7 | 16.7 | 16.7 |
| KBM503 | (D) | 3.3 | 3.3 | 3.3 | 3.3 |
| C.I. Pigment Green 36 | (E) | 150 | 150 | 150 | 150 |
| S32000 | (F) | 10 | 10 | 10 | 10 |
| PMA | (G) | 800 | 800 | 800 | 800 |
| Viscosity (cps/25° C.) |  | 6.2 | 7.9 | 11.3 | 13.8 |

Note:
The amounts in the Tables 3 and 4 were based on that total weight of the components (A) and (B) as 100% by weight and components (C), (D), (E), (F), and (G) are each calculated relative to the total weight of the components (A) and (B) as 100% by weight.
TPGDA: tripropylene glycol diacrylate manufactured by AGI Corporation, Taiwan
KBM503: 3-methacryoyloxypropyl triethoxy silane commercial available from Shin-Etsu Chemical Co., Ltd.
Igacure 907: 2-methyl-(4-methylthienyl)-2-morphline-propane-1-one commercial available from Ciba Specialty Chemicals
S32000: dispersant commercial available Avecia Fine Chemicals Ltd.
PMA: propylene glycol monomethyl ether acetate Experimental Example 2

Test for Chemical Resistance, Heat Resistance, and Yellowing Resistance

Each photo resist compositions Nos. 6~13 was coated on a glass substrate into a film at a thickness of from 1~3 μm. The resist-coated substrates were pre-baked at a temperature of from 70~110° C. for 100~300 seconds, exposed with UV light at a dose of 50~200 mJ/cm$^2$, developed with NaOH solution for 20~150 seconds, and then post-baked at a temperature of from 200~250° C. for 20~40 minutes. The resultant substrates were each immersed in various solvents (80° C. water; propylene glycol monomethyl ether(PM), N-methylpyrrolidine (NMP), 2.38% ammonium tetramethyl hydroxide (TMAH) solution) for 5~20 minutes (i.e. chemical resistance test), respectively. Also, the resultant substrates were exposed in various conditions (170° C. in air, 10 hours; i.e. heat resistance test), and determined their yellowing resistance in term of ΔE*ab. The results are summarized in Tables 5 and 6.

TABLE 5

|  | Photo resist composition 6 (ΔE*ab) | Photo resist composition 7 (ΔE*ab) | Photo resist composition 8 (ΔE*ab) | Photo resist composition 9 (ΔE*ab) |
|---|---|---|---|---|
| Water at 80° C. | 0.67 | 0.60 | 0.58 | 0.76 |
| PM | 1.47 | 1.49 | 1.02 | 1.64 |
| NMP | 1.35 | 1.22 | 1.25 | 1.82 |
| TMAH 2.38% | 0.98 | 1.14 | 0.76 | 0.84 |
| Air at 170° C. | 0.79 | 0.79 | 0.68 | 0.96 |

TABLE 6

|  | Photo resist composition 10 (ΔE*ab) | Photo resist composition 11 (ΔE*ab) | Photo resist composition 12 (ΔE*ab) | Photo resist composition 13 (ΔE*ab) |
|---|---|---|---|---|
| Water at 80° C. | 0.96 | 0.63 | 0.61 | 1.03 |
| PM | 1.04 | 1.38 | 1.25 | 1.78 |
| NMP | 1.16 | 1.55 | 1.49 | 1.68 |
| TMAH 2.38% | 0.52 | 0.65 | 0.61 | 1.49 |
| Air at 170° C. | 0.60 | 0.71 | 0.62 | 1.08 |

Note:
The ΔE*ab value showing coloring was obtained from the difference between the color value before test and after test by using spectrophotometric measurements, MCPD3000, manufactured by Otsuka Electrics-Corp (color difference ΔE*ab was quantitative analyzed based on CIE L*a*b* system).

From the above results, it showed that although the polyurethanes 6~13 of Examples 10~17 were present in the above photo resist compositions in an amount of up to 10 wt %, they provide excellent heat resistance, chemical resistance, and yellowing resistance (i.e. ΔE*ab≦3) due to the more urethane groups (for providing more hydrogen bonds) and acrylic group contained in the polyurethanes. Moreover, the photo resist composition is in a single phase, it shows that the ingredients consisting the resist composition are high miscible with each other.

The polyurethane of the present invention is a radiation curable resin which is high cross-linking upon radiation, when it is useful as main ingredient in a photo resist, it can fixed pigment onto the substrate to increase the chemical resistance and heat resistance after forming into a film.

Moreover, when the polyurethane of the present invention is formulated into a photo resist and added with appropriate dispersants and adjuvants, the photo resist can be subjected to low temperature curing process (i.e. <150° C.) to form a film with flexibility and exhibits excellent adhesion to plastic substrate such as polyimide (PI), polyether sulfones (PES), polycarbonates (PC), and the like. The low temperature curing process comprises, for example, pre-baking at 70~100° C. for 100~300 seconds; exposing at a dose of 50~200 mJ/cm$^2$; developing in alkali solution for 20~150 seconds; exposing at a dose of 50~200 mJ/cm$^2$ again; and post-baking at 150° C. for 20~60 minutes.

Additional advantages and modifications will be readily made to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A curable and developable polyurethanes, which is characterized by having a carboxy group in its main chain and a (meth)acryloyl group in its side chain and comprising the following repeat units (I), (II), and (II) in a random arrangement

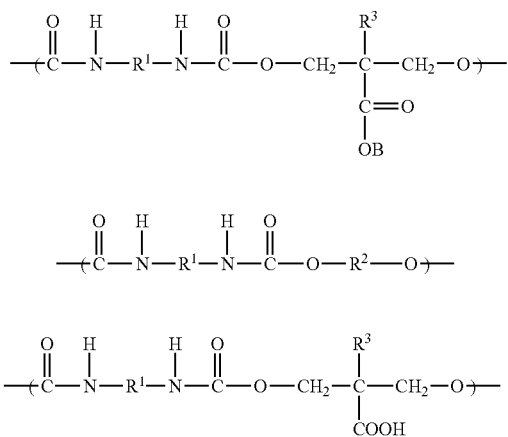

wherein:
$R^1$ represents a $C_{1-12}$ straight or branched alkylene group, a $C_{3-8}$ cyclic alkylene group, a phenylene group, a biphenylene group, a naphthalene group, a xylenenyl group, a divalent toludine group, a group of -Ph-A-Ph- (wherein A represents $CH_2$, $-NH-$, or $-O-$), these groups are each optionally substituted by a $C_{1-6}$ alkyl group; $R^2$ represents a divalent aliphatic group which optionally has one or more OH substituents, wherein the OH substituents are optionally further reacted with a diisocyanate group; $R^3$ represents a $C_{1-6}$ straight or branched alkyl group which optionally has one or more OH substituents, wherein the OH substituents are optionally further reacted with a diisocyanate group; B represents the groups represented by formula (IV):

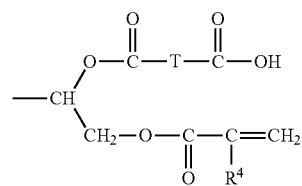

in which $R^4$ represents H or $CH_3$; and
T represents one or more substituents selected from the group consisting of the following formulae:

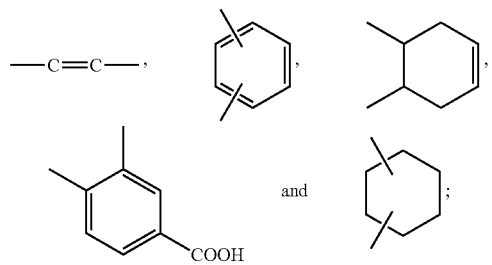

the polyurethane has a weight molecular weight measured by GPC in a range of from 3,000 to 400,000; an acid value in a range of from 5 to 120 mgKOH/g.

2. The polyurethane according to claim 1, wherein the polyurethane has a weight molecular weight in a range of from 6,000 to 80,000.

3. The polyurethane according to claim 1, wherein the polyurethane has an acid value in a range of from 10 to 60 mgKOH/g.

4. A process for preparing the polyurethane according to claim 1, which comprises the steps of: (a) reacting a carboxylic acid having at least two hydroxyl groups, a polyol and, a diisocyanate to obtain a polyurethane having a carboxyl group in its main chain; (b) ring-opening an epoxy-containing (meth)acrylate with the carboxyl acid on the main chain of the product in step (a) to obtain a polyurethane having a hydroxyl group and an (meth)acryloyl group in side chain; and (c) reacting the hydroxyl group of the polyurethane with an anhydride.

5. A photo resist composition, which comprises (A) radiation curable and developable polyurethane according to claim 1; (B) a (meth)acrylic acid monomer; and (C) a photo initiator; wherein the weight ratio of the component (A) to component (B) ((A):(B)) is from 40~90:10~60, and the component (C) is in an amount of from 1~50% by weight, based on the total weight of components (A) and (B) as 100% by weight.

6. The photo resist composition according to claim 5, which further comprises adhering adjuvants (D) in an amount of 0.1~5% by weight, based on the total weight ratio of components (A) and (B) as 100% by weight.

7. The photo resist composition according to claim 5, which further comprises pigments (E) in an amount of 70~600% by weight, based on the total weight ratio of components (A) and (B) as 100% by weight.

8. The photo resist composition according to claim 5, which further comprises dispersants (F) in an amount of 3~15% by weight, based on the total weight ratio of components (A) and (B) as 100% by weight.

9. The photo resist composition according to claim 5, which further comprises solvents (G) in an amount of 200~2500% by weight, based on the total weight ratio of components (A) and (B) as 100% by weight.

* * * * *